(12) United States Patent
Shishido et al.

(10) Patent No.: US 10,453,980 B2
(45) Date of Patent: Oct. 22, 2019

(54) PHOTODETECTION DEVICE AND IMAGING DEVICE

(71) Applicant: Panasonic Intellectual Property Management Co., Ltd., Osaka (JP)

(72) Inventors: Sanshiro Shishido, Osaka (JP); Masayuki Takase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/000,881

(22) Filed: Jun. 5, 2018

(65) Prior Publication Data

US 2019/0006542 A1 Jan. 3, 2019

(30) Foreign Application Priority Data

Jun. 29, 2017 (JP) .................. 2017-127480

(51) Int. Cl.
H01L 31/0352 (2006.01)
H01L 31/101 (2006.01)
H01L 27/14 (2006.01)
H01L 27/146 (2006.01)

(52) U.S. Cl.
CPC ........... H01L 31/035281 (2013.01); H01L 27/14665 (2013.01); H01L 31/101 (2013.01)

(58) Field of Classification Search
CPC ........... H01L 31/035281; H01L 31/101; H01L 1127/14665
USPC ........................................... 257/443
See application file for complete search history.

(56) References Cited

U.S. PATENT DOCUMENTS

| 2004/0263657 A1* | 12/2004 | Sakamoto | ......... H01L 27/14603 348/311 |
|---|---|---|---|
| 2008/0030607 A1 | 2/2008 | Ikeda et al. | |
| 2012/0200842 A1 | 8/2012 | Kamiyama et al. | |
| 2017/0006241 A1* | 1/2017 | Shishido | ............... H04N 5/378 |

FOREIGN PATENT DOCUMENTS

| JP | 2007-201160 | 8/2007 |
| JP | 2011-082358 | 4/2011 |
| JP | 2017-017583 | 1/2017 |

* cited by examiner

*Primary Examiner* — Tong-Ho Kim
(74) *Attorney, Agent, or Firm* — McDermott Will & Emery LLP

(57) ABSTRACT

A photodetection device includes: a photoelectric converter generating charge; a first channel having first and second ends, the first end being connected to the photoelectric converter, charge being transferred from the first end toward the second end; a second channel diverging from the first channel at a first position of the first channel; a third channel diverging from the first channel at a second position of the first channel; a first accumulator accumulating charge transferred from the first channel through the second channel; a second accumulator accumulating charge transferred from the first channel through the third channel; and at least one first gate electrode switching between transfer/cutoff of charge in the second channel, and switching between transfer/cutoff of charge in the third channel, a width of the first channel at the first end being greater than a width of the first channel at the second end in a plan view.

16 Claims, 16 Drawing Sheets

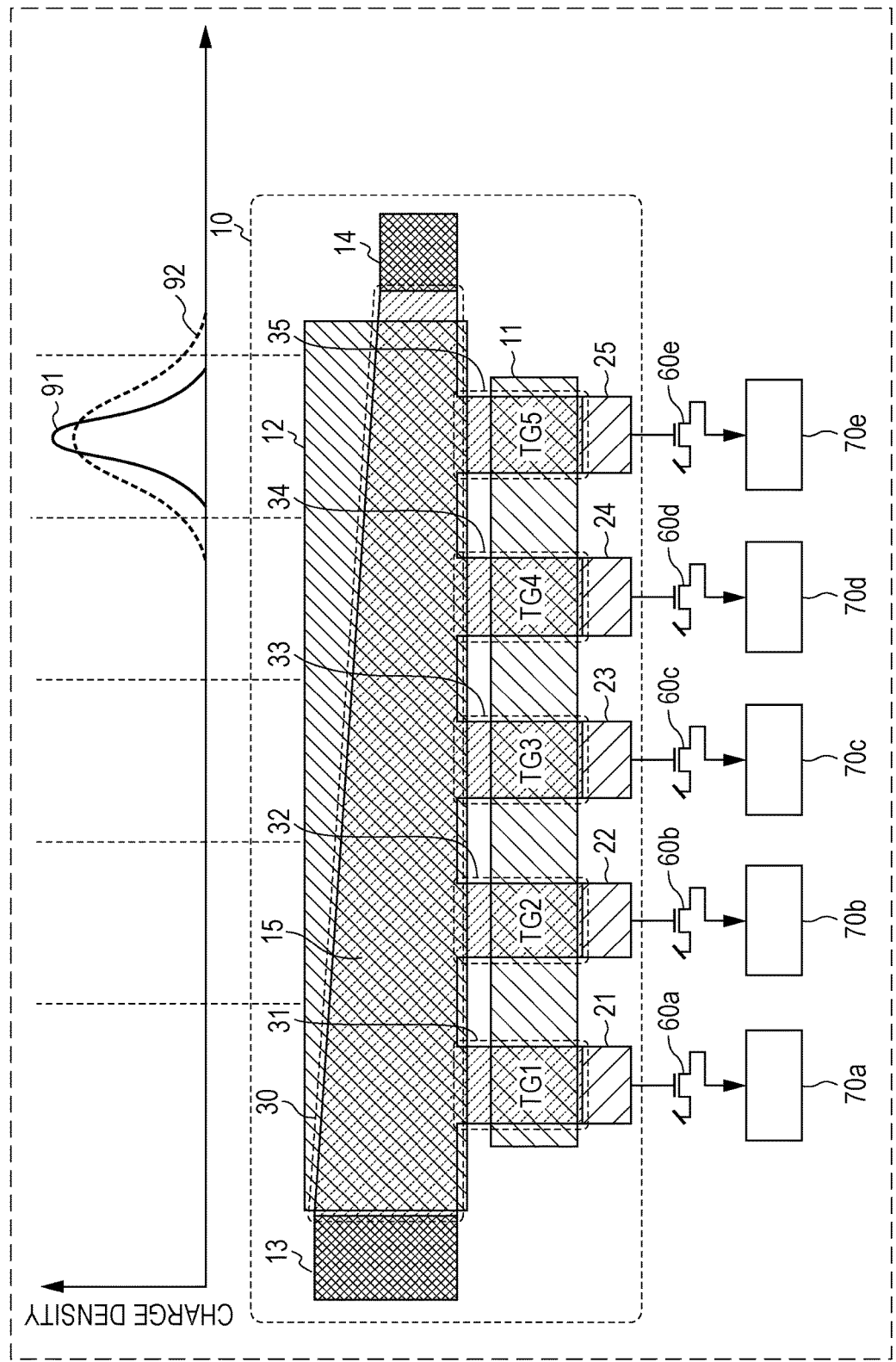

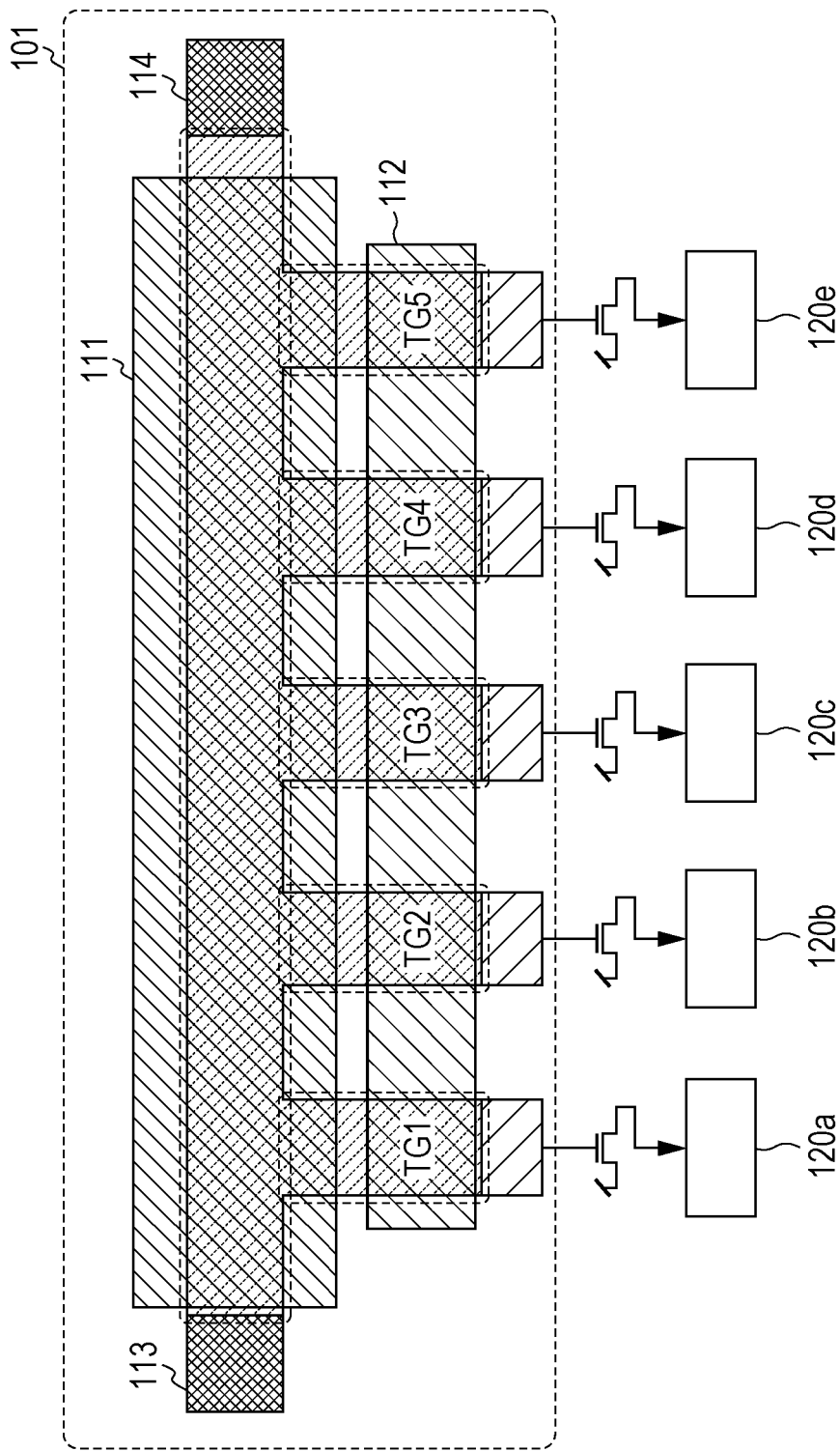

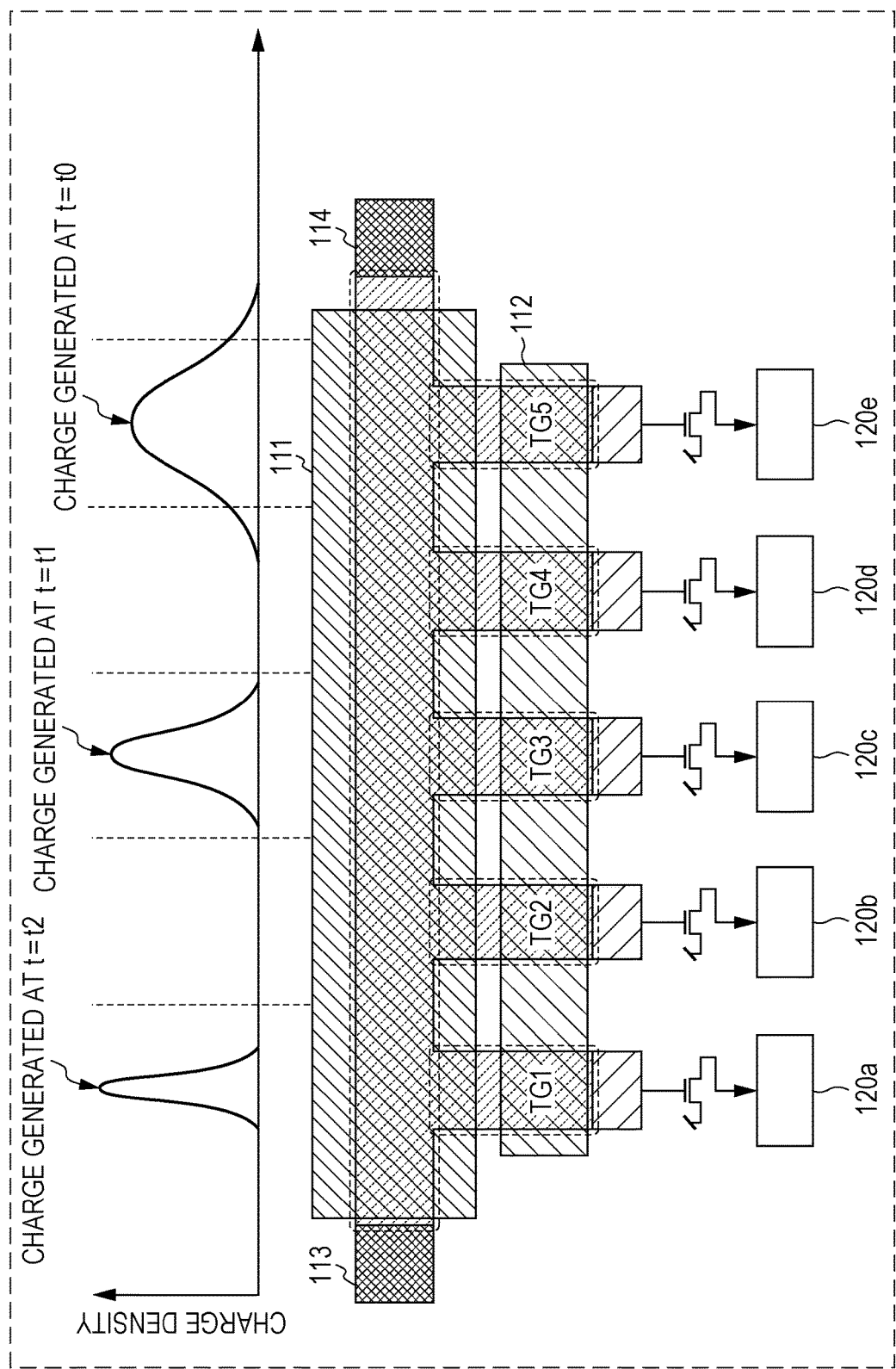

PHOTODETECTION DEVICE AND IMAGING DEVICE

BACKGROUND

1. Technical Field

The present disclosure relates to a photodetection device that detects light.

2. Description of the Related Art

Photodetection devices that detect a timing at which light is incident are known (see Japanese Unexamined Patent Application Publication No. 2017-17583, for example). According to these photodetection devices, a timing at which light is incident can be detected at an accuracy of a certain degree.

SUMMARY

A further improvement in temporal resolution is desired in the detection of a timing at which light is incident.

In one general aspect, the techniques disclosed here feature a photodetection device provided with: a photoelectric converter that generates charge; a first charge transfer channel that has a first end and a second end, the first end being connected to the photoelectric converter, charge from the photoelectric converter being transferred in the first charge transfer channel in a first direction from the first end toward the second end; a second charge transfer channel that diverges from the first charge transfer channel at a first position of the first charge transfer channel; a third charge transfer channel that diverges from the first charge transfer channel at a second position of the first charge transfer channel, the second position being further than the first position from the first end in the first direction; a first charge accumulator that accumulates charge transferred from the first charge transfer channel through the second charge transfer channel; a second charge accumulator that accumulates charge transferred from the first charge transfer channel through the third charge transfer channel; and at least one first gate electrode that switches between transfer and cutoff of charge in the second charge transfer channel, and that switches between transfer and cutoff of charge in the third charge transfer channel. A width of the first charge transfer channel at the first end is greater than a width of the first charge transfer channel at the second end in a plan view.

General or specific aspects may be realized by means of an element, a device, a module, a system, an integrated circuit, or a method. Furthermore, general or specific aspects may be realized by means of an arbitrary combination of an element, a device, a module, a system, an integrated circuit, and a method.

Additional benefits and advantages of the disclosed embodiments will be apparent from the specification and figures. The benefits and/or advantages may be individually provided by the various embodiments or features disclosed in the specification and figures, and need not all be provided in order to obtain one or more of the same.

BRIEF DESCRIPTION OF THE DRAWINGS

FIG. 9 is a schematic view depicting the way in which a spread in the distribution of charge density is suppressed in a charge group that is traveling through the first charge transfer channel;

FIG. 16 is a configuration diagram of a photodetection device according to a reference example; and FIG. 17 is a schematic view depicting the distribution of a charge group that is traveling, in the photodetection device according to the reference example.

Figure 1:
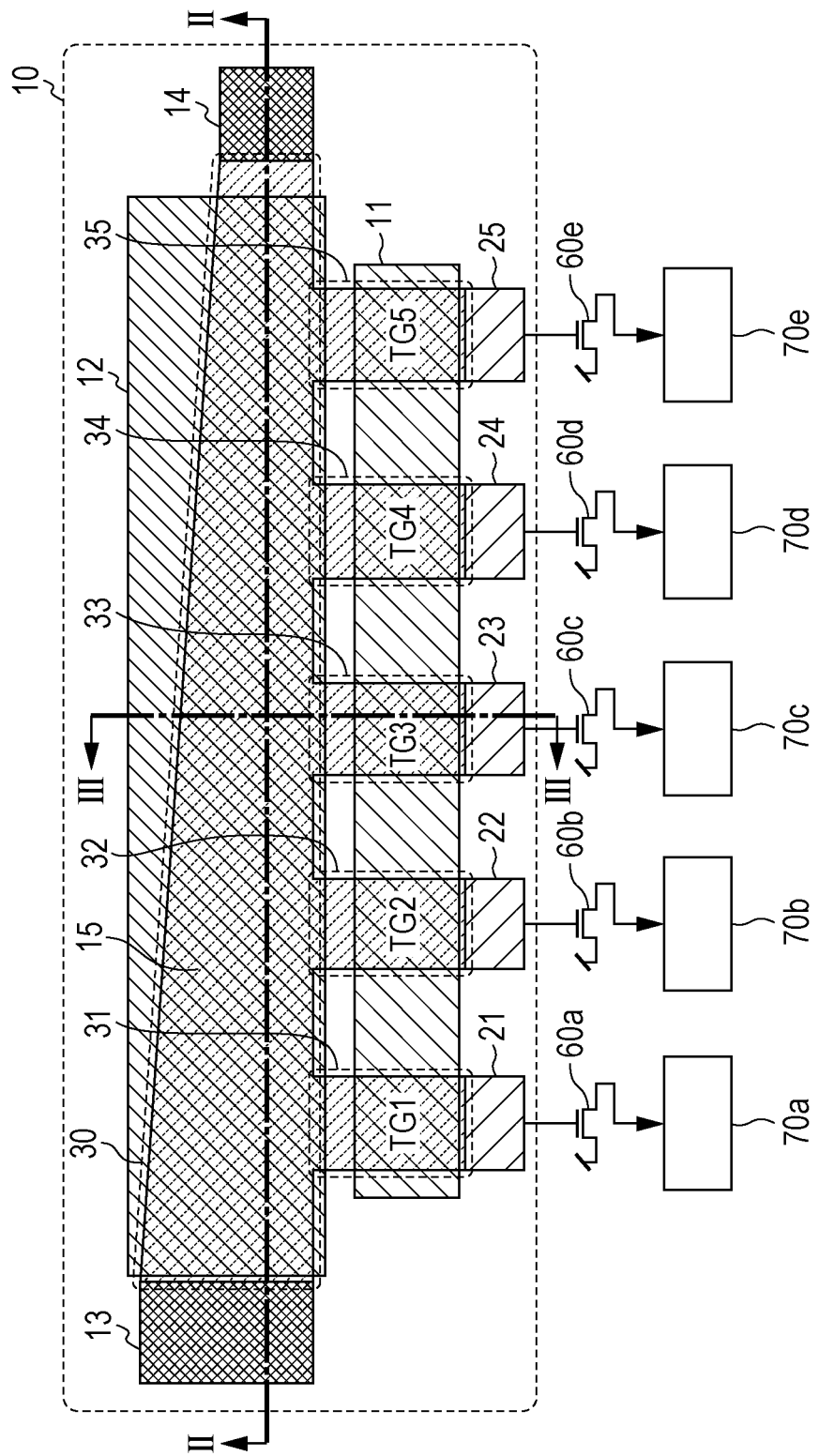
FIG. 1 is a plan view of a photodetection device according to an embodiment.

DETAILED DESCRIPTION (Underlying Knowledge Forming Basis of Aspect of the Present Disclosure)

Here, first, a photodetection device of a reference example will be described.

FIG. 16 is a configuration diagram of the photodetection device (in other words, an imaging element 101) according to the reference example.

In the photodetection device of the reference example, first, a channel (also referred to as a transfer channel) is formed below a first gate electrode 111 by controlling the potential of the first gate electrode 111. Then, a charge group that has been generated by light being incident on a light receiving unit 113 is made to travel from the light receiving unit 113 side to a charge sweeping unit 114 side within that transfer channel. Then, while the charge group is traveling, at least a portion of that traveling charge group is guided to a plurality of FDs that are respectively connected to read circuits (120a to 120e), by controlling the potential of a second gate electrode 112. Then, by specifying the position of an FD from which at least a portion of the traveling charge group has been read, the time at which that charge group was generated, in other words, the timing at which light was incident, is detected.

In relation to the photodetection device of the reference example, the inventor repeatedly carried out investigations in order to further improve temporal resolution in the detection of a timing at which light is incident.

FIG. 17 is a schematic view depicting the distribution of a charge group that is traveling, in the photodetection device of the reference example.

As depicted in the same drawing, the distribution of the charge density of the traveling charge group widens as the travel distance thereof increases, in other words, as the charge group travels further from the light receiving unit 113. Therefore, a charge group that has traveled to a position that is comparatively far from the light receiving unit 113 (in the vicinity of TG5 in FIG. 17, for example) is sometimes read by a plurality of read circuits.

The inventor discovered that temporal resolution in the detection of a timing at which light is incident can be improved by suppressing this kind of spread in the distribution of charge density, in a photodetection device.

As a result of repeatedly carrying out such investigations, the inventor conceived of the photodetection device and the imaging device described hereinafter.

A photodetection device according to one aspect of the present disclosure is provided with: a photoelectric converter that generates charge; a first charge transfer channel that has a first end and a second end, the first end being connected to the photoelectric converter, charge from the photoelectric converter being transferred in the first charge transfer channel in a first direction from the first end toward the second end; a second charge transfer channel that diverges from the first charge transfer channel at a first position of the first charge transfer channel; a third charge transfer channel that diverges from the first charge transfer channel at a second position of the first charge transfer channel, the second position being further than the first position from the first end in the first direction; a first charge accumulator that accumulates charge transferred from the first charge transfer channel through the second charge transfer channel; a second charge accumulator that accumulates charge transferred from the first charge transfer channel through the third charge transfer channel; and at least one first gate electrode that switches between transfer and cutoff of charge in the second charge transfer channel, and that switches between transfer and cutoff of charge in the third charge transfer channel. A width of the first charge transfer channel at the first end is greater than a width of the first charge transfer channel at the second end in a plan view.

In the photodetection device having the aforementioned configuration, the width of the first end at the photoelectric conversion unit (i.e., light receiving unit) side is greater than the width of the second end at the far side from the photoelectric conversion unit. Therefore, with regard to an electric field that is applied to the first charge transfer channel, the electric field at the second end side becomes larger than the electric field at the first end side due to the effect of a fringing electric field. It is known that, generally, the charge dispersion in a space is suppressed as the electric field intensity in that space increases. Therefore, in a charge group that is traveling through the first charge transfer channel, the charge dispersion is more strongly suppressed, as mentioned above, the further the charge is located from the photoelectric conversion unit. Therefore, the photodetection device having the aforementioned configuration is able to suppress a spread in the distribution of charge density in a charge group that has traveled to a position that is comparatively far from the photoelectric conversion unit.

Consequently, according to the photodetection device having the aforementioned configuration, it is possible to improve temporal resolution in the detection of a timing at which light is incident.

An imaging device according to one aspect of the present disclosure is provided with a pixel array in which a plurality of pixels configured from the aforementioned photodetection device are arranged in an array.

The plurality of pixels provided in the imaging device having the aforementioned configuration are configured from photodetection devices that can improve temporal resolution in the detection of a timing at which light is incident.

Consequently, according to the imaging device having the aforementioned configuration, it is possible to improve temporal resolution in the detection of a timing at which light is incident.

Hereinafter, specific examples of the photodetection device and the imaging device according to one aspect of the present disclosure will be described with reference to the drawings. The embodiments given here all represent specific examples of the present disclosure. Consequently, the numerical values, the shapes, the constituent elements, the arrangement and mode of connection of the constituent elements, the steps (processes), the order of the steps, and the like given in the following embodiments are examples and do not restrict the present disclosure. From among the constituent elements in the following embodiments, constituent elements that are not mentioned in the independent claims are constituent elements that may be optionally added. Furthermore, each drawing is a schematic view and is not necessarily depicted in an exact manner.

Embodiment

Hereinafter, an imaging device according to an embodiment will be described with reference to the drawings. This imaging device is provided with a pixel array in which a plurality of pixels configured from photodetection devices according to the embodiment are arranged in an array.

[1-1. Configuration]

Here, first, a photodetection according to the embodiment will be described.

Figure 2:
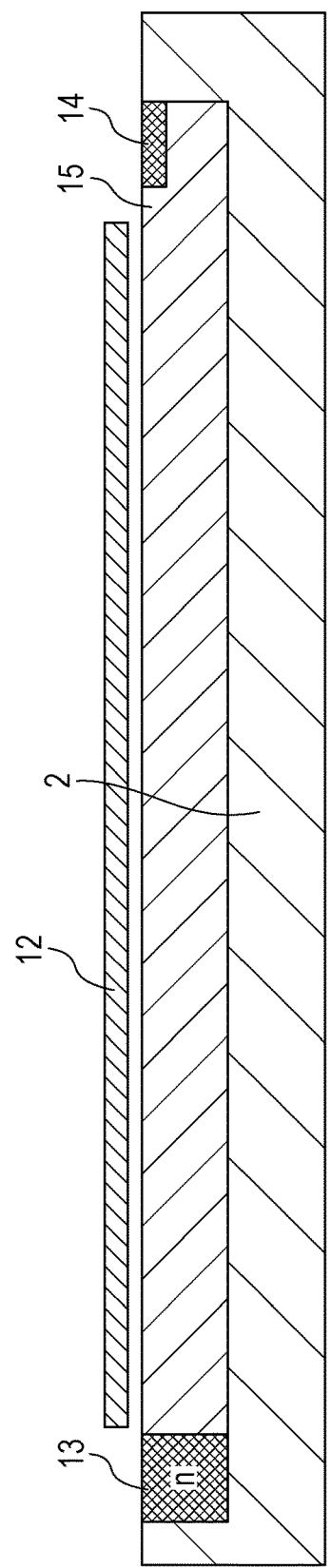
FIG. 2 is a cross-sectional view along line II-II of the photodetection device according to the embodiment.
Figure 3:
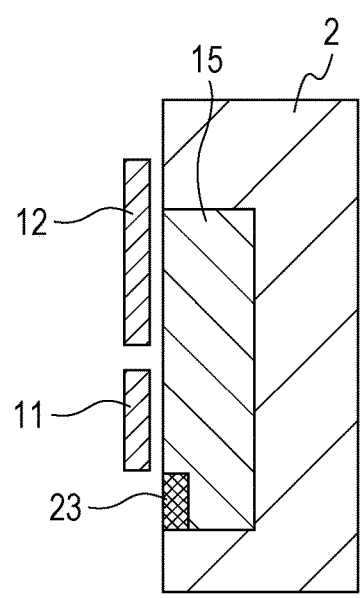
FIG. 3 is a cross-sectional view along line III-III of the photodetection device according to the embodiment.

FIG. 1 is a plan view of a photodetection device 10 according to the embodiment. FIG. 2 is a cross-sectional view along line II-II depicted in FIG. 1, of the photodetection device 10 according to the embodiment. FIG. 3 is a cross-sectional view along line III-III depicted in FIG. 1, of the photodetection device 10 according to the embodiment.

As depicted in FIGS. 1, 2, and 3, the photodetection device 10 is configured including a first gate electrode 11, a second gate electrode 12, a photoelectric conversion unit 13, a charge sweeping unit 14, an injection region 15, a first charge accumulation unit 21, a second charge accumulation unit 22, a third charge accumulation unit 23, a fourth charge accumulation unit 24, and a fifth charge accumulation unit 25.

It should be noted that FIGS. 1, 2, and 3 are merely schematic drawings for illustration purposes, and the sizes of the parts in the drawings do not necessarily reflect the actual sizes. Likewise also in other drawings, the size of an element depicted in the drawings may not match the actual size of that element.

The photoelectric conversion unit 13 includes a photoelectric conversion element that is capable of receiving incident light and generating charge. Here, a photodiode is given as an example of the photoelectric conversion element.

As depicted in FIGS. 2 and 3, in this example, the photoelectric conversion unit 13, the charge sweeping unit 14, the injection region 15, the first charge accumulation unit 21, the second charge accumulation unit 22, the third charge accumulation unit 23, the fourth charge accumulation unit 24, and the fifth charge accumulation unit 25 are formed within a semiconductor substrate 2 such as a silicon (Si) substrate. The semiconductor substrate 2 is not restricted to a substrate in which the entirety thereof is a semiconductor, and may be an insulating substrate or the like in which a semiconductor layer is provided on the surface of a side on which a photosensitive region is formed. Hereinafter, a p-type silicon substrate is given as an example of the semiconductor substrate 2. In this example, the photoelectric conversion unit 13 is formed by forming an impurity region (here, an N-type region) in the p-type silicon substrate. Furthermore, the injection region 15 (diffusion region) is formed by forming an impurity region (here, an N-type region) having a impurity concentration that is equivalent to or higher than that of the photoelectric conversion unit 13 in the p-type silicon substrate. Also, the first charge accumulation unit 21, the second charge accumulation unit 22, the third charge accumulation unit 23, the fourth charge accumulation unit 24, and the fifth charge accumulation unit 25 are formed by forming impurity regions (here, N-type regions) having a impurity concentration that is higher than that of the injection region 15 in the p-type silicon substrate.

As depicted in FIG. 1, the injection region 15 is configured from a main section 30, a first finger section 31, a second finger section 32, a third finger section 33, a fourth finger section 34, and a fifth finger section 35. The main section 30 has a long tapered shape. One end of the main section 30 is connected to the photoelectric conversion unit 13 and the other end is connected to the charge sweeping unit 14. The first finger section 31 diverges from the main section 30 and is connected to the first charge accumulation unit 21. The second finger section 32 diverges from the main section 30 and is connected to the second charge accumulation unit 22. The third finger section 33 diverges from the main section 30 and is connected to the third charge accumulation unit 23. The fourth finger section 34 diverges from the main section 30 and is connected to the fourth charge accumulation unit 24. The fifth finger section 35 diverges from the main section 30 and is connected to the fifth charge accumulation unit 25.

As depicted in FIG. 1, the main section 30 has one end at the photoelectric conversion unit 13 side (hereinafter, also referred to as a "fifth end") and another end at the charge sweeping unit 14 side (hereinafter, also referred to as a "sixth end"), and the width of the fifth end is greater than the width of the sixth end. Also, the width of the main section 30 monotonically decreases from the fifth end toward the sixth end. Furthermore, the fifth finger section 35 diverges from the main section 30 at a position that is further than the fourth finger section 34 from the photoelectric conversion unit 13. The fourth finger section 34 diverges from the main section 30 at a position that is further than the third finger section 33 from the photoelectric conversion unit 13. The third finger section 33 diverges from the main section 30 at a position that is further than the second finger section 32 from the photoelectric conversion unit 13. The second finger section 32 diverges from the main section 30 at a position that is further than the first finger section 31 from the photoelectric conversion unit 13.

As depicted in FIGS. 1 to 3, the first gate electrode 11 is rectangular and is arranged extending from the first finger section 31 to the fifth finger section 35 overlaid thereabove. Also, the second gate electrode 12 is rectangular and is arranged overlaid above the main section 30. As depicted in FIG. 1, one end of the second gate electrode 12 at the photoelectric conversion unit 13 side and one end at the charge sweeping unit 14 side are both wider than the widths of the main section 30 directly therebelow.

Here, a transistor formed by the first gate electrode 11 and the first finger section 31 is referred to as a TG1. A transistor formed by the first gate electrode 11 and the second finger section 32 is referred to as a TG2. A transistor formed by the first gate electrode 11 and the third finger section 33 is referred to as a TG3. A transistor formed by the first gate electrode 11 and the fourth finger section 34 is referred to as a TG4. A transistor formed by the first gate electrode 11 and the fifth finger section 35 is referred to as a TG5.

In the injection region 15, a predetermined potential is applied to a gate electrode positioned thereabove (here, the first gate electrode 11 or the second gate electrode 12, for example), and an inversion layer is thereby formed on a surface portion thereof. This inversion layer functions as a charge transfer channel that transfers charge generated by the photoelectric conversion unit 13 to any of the charge sweeping unit 14, the first charge accumulation unit 21, the second charge accumulation unit 22, the third charge accumulation unit 23, the fourth charge accumulation unit 24, or the fifth charge accumulation unit 25.

Figure 4:
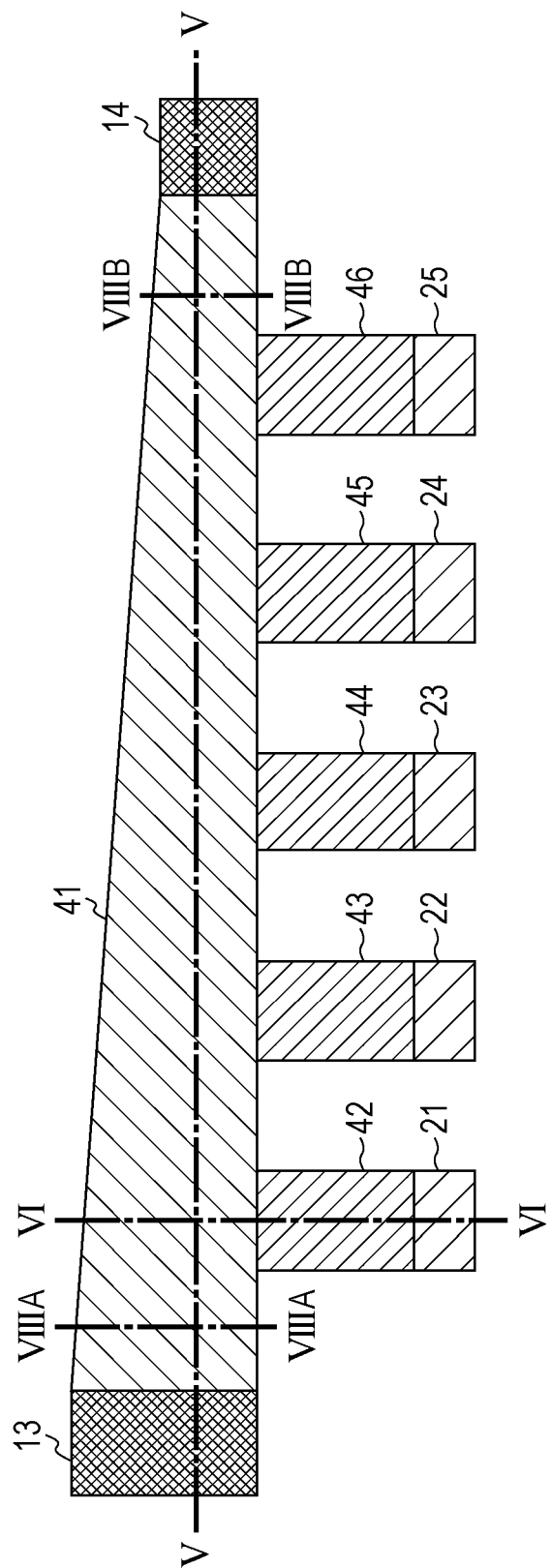
FIG. 4 is a schematic view of charge transfer channels formed in the photodetection device according to the embodiment.

FIG. 4 is a schematic view schematically depicting charge transfer channels formed in a case where a first predetermined potential is applied to the first gate electrode 11 and a second predetermined potential is applied to the second gate electrode 12. Here, the first predetermined potential is a potential for forming inversion layers on the surfaces of the injection region 15 positioned below the first gate electrode 11. Furthermore, the second predetermined potential is a potential for forming an inversion layer on the surface of the injection region 15 positioned below the second gate electrode 12.

As depicted in FIG. 4, the charge transfer channels formed on the surface of the injection region 15 are configured from a first charge transfer channel 41 having a long tapered shape, a second charge transfer channel 42, a third charge transfer channel 43, a fourth charge transfer channel 44, a fifth charge transfer channel 45, and a sixth charge transfer channel 46. One end and the other end of the first charge transfer channel are respectively connected to the photoelectric conversion unit 13 and the charge sweeping unit 14. The second charge transfer channel 42 diverges from the first charge transfer channel 41 and is connected to the first charge accumulation unit 21. The third charge transfer channel 43 diverges from the first charge transfer channel 41 and is connected to the second charge accumulation unit 22. The fourth charge transfer channel 44 diverges from the first charge transfer channel 41 and is connected to the third charge accumulation unit 23. The fifth charge transfer channel 45 diverges from the first charge transfer channel 41 and is connected to the fourth charge accumulation unit 24. The sixth charge transfer channel 46 diverges from the first charge transfer channel 41 and is connected to the fifth charge accumulation unit 25. Furthermore, as depicted in FIG. 4, the first charge transfer channel 41 has one end at the photoelectric conversion unit 13 side (hereinafter, also referred to as a "first end") and another end at the charge sweeping unit 14 side (hereinafter, also referred to as a "second end"), and the width of the first end is greater than the width of the second end. Also, the width of the first charge transfer channel 41 monotonically decreases from the first end toward the second end. Furthermore, the sixth charge transfer channel 46 diverges from the first charge transfer channel 41 at a position that is further than the fifth charge transfer channel 45 from the photoelectric conversion unit 13. The fifth charge transfer channel 45 diverges from the first charge transfer channel 41 at a position that is further than the fourth charge transfer channel 44 from the photoelectric conversion unit 13. The fourth charge transfer channel 44 diverges from the first charge transfer channel 41 at a position that is further than the third charge transfer channel 43 from the photoelectric conversion unit 13. The third charge transfer channel 43 diverges from the first charge transfer channel 41 at a position that is further than the second charge transfer channel 42 from the photoelectric conversion unit 13. Also, the width of the first charge transfer channel 41 at a first diverging position where the second charge transfer channel 42 diverges from the first charge transfer channel 41 is greater than the width of the first charge transfer channel 41 at a second diverging position where the third charge transfer channel 43 diverges from the first charge transfer channel 41. The width of the first charge transfer channel 41 at the second diverging position is greater than the width of the first charge transfer channel 41 at a third diverging position where the fourth charge transfer channel 44 diverges from the first charge transfer channel 41. The width of the first charge transfer channel 41 at the third diverging position is greater than the width of the first charge transfer channel 41 at a fourth diverging position where the fifth charge transfer channel 45 diverges from the first charge transfer channel 41. The width of the first charge transfer channel 41 at the fourth diverging position is greater than the width of the first charge transfer channel 41 at a fifth diverging position where the sixth charge transfer channel 46 diverges from the first charge transfer channel 41.

The first charge transfer channel 41 transfers charge generated by the photoelectric conversion unit 13 to the charge sweeping unit 14 due to the potential of the charge sweeping unit 14 being set to a predetermined potential that is lower than the potential of the photoelectric conversion unit 13.

Figure 5:
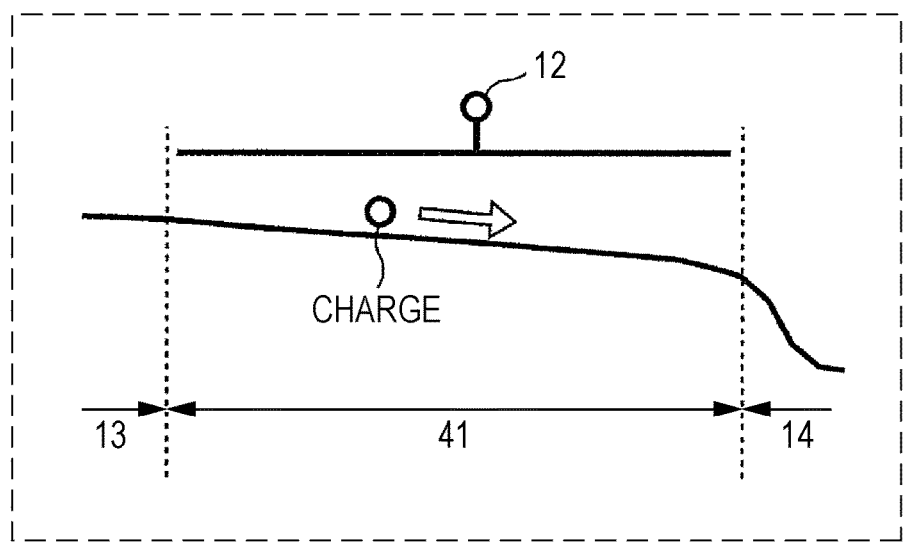
FIG. 5 is a schematic view depicting the way in which a first charge transfer channel transfers charge.

FIG. 5 is a schematic view depicting the way in which the first charge transfer channel 41 transfers charge, in a cross section along line V-V depicted in FIG. 4. The solid line indicates the potential in the cross section along line V-V depicted in FIG. 4.

As depicted in the same drawing, due to the potential of the charge sweeping unit 14 being set to a predetermined potential that is lower than the potential of the photoelectric conversion unit 13, the potential within the first charge transfer channel 41 slants from the photoelectric conversion unit 13 side toward the charge sweeping unit 14 side. Thus, the first charge transfer channel 41 transfers the charge generated by the photoelectric conversion unit 13 to the charge sweeping unit 14.

Figure 6:
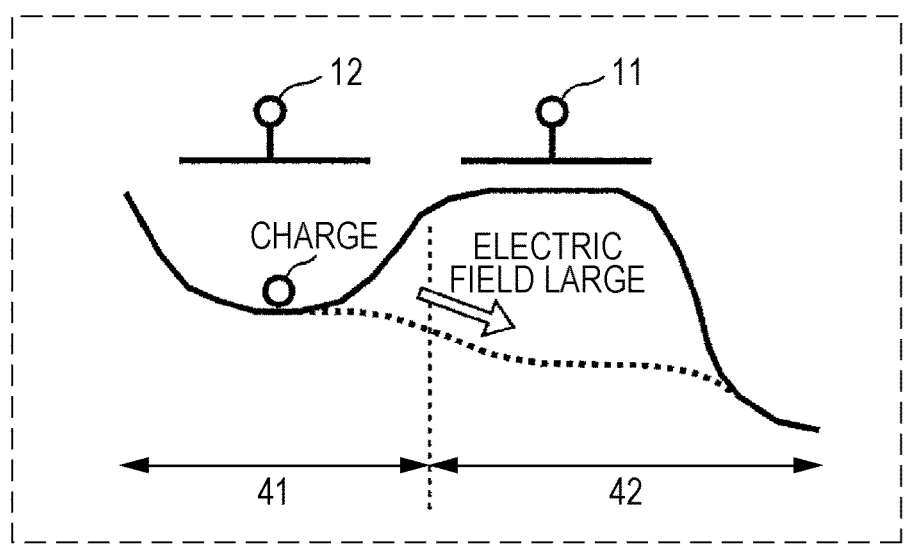
FIG. 6 is a schematic view depicting the way in which a second charge transfer channel transfers charge.

FIG. 6 is a schematic view depicting the way in which the second charge transfer channel 42 transfers charge, in a cross section along line VI-VI depicted in FIG. 4. The solid line indicates the potential when the transistor TG1 is off, in the cross section along line VI-VI depicted in FIG. 4. The dotted line indicates the potential when the transistor TG1 is on, in the cross section along line VI-VI depicted in FIG. 4.

As depicted in the same drawing, due to the potential of the first charge accumulation unit 21 being set to a predetermined potential that is lower than the potential of a diverging point to the second charge transfer channel 42 in the first charge transfer channel 41, the potential within the second charge transfer channel 42 slants from the first charge transfer channel 41 side toward the first charge accumulation unit 21 side as indicated by the dotted line in FIG. 6. Therefore, the second charge transfer channel 42 transfers a portion of charge of the charge group being transferred through the first charge transfer channel 41, to the first charge accumulation unit 21.

However, the second charge transfer channel 42 is not formed in a case where the TG1 is off. In this case, the potential between the diverging point to the second charge transfer channel 42 in the first charge transfer channel 41 and the first charge accumulation unit 21 becomes as indicated by the solid line in FIG. 6. Therefore, in this case, the charge traveling through the first charge transfer channel 41 is not transferred to the first charge accumulation unit 21.

Similarly, due to each of the potentials of the second charge accumulation unit 22 to the fifth charge accumulation unit 25 being set to predetermined potentials that are lower than the potentials of the diverging points to the third charge transfer channel 43 to the sixth charge transfer channel 46 in the first charge transfer channel 41, each of the third charge transfer channel 43 to the sixth charge transfer channel 46 transfers a portion of charge of the charge group being transferred through the first charge transfer channel 41, to the second charge accumulation unit 22 to the fifth charge accumulation unit 25.

The first charge accumulation unit 21 accumulates charge transferred through the second charge transfer channel 42. The second charge accumulation unit 22 accumulates charge transferred through the third charge transfer channel 43. The third charge accumulation unit 23 accumulates charge transferred through the fourth charge transfer channel 44. The fourth charge accumulation unit 24 accumulates charge transferred through the fifth charge transfer channel 45. The fifth charge accumulation unit 25 accumulates charge transferred through the sixth charge transfer channel 46.

As depicted in FIG. 1, the first charge accumulation unit 21 to the fifth charge accumulation unit 25 are respectively connected to read circuits 70a to 70e, which read accumulated amounts of charge, via source follower transistors 60a to 60e.

The first gate electrode 11 and the second gate electrode 12 are formed from polysilicon to which electrical conductivity has been imparted by being injected with an impurity, for example.

The first gate electrode 11 can switch between whether or not inversion layers are formed on the surfaces of the injection region 15 positioned below the first gate electrode 11, by switching an applied voltage.

In other words, the first gate electrode 11 switches between transfer and cutoff of charge that has passed through the second charge transfer channel 42, switches between transfer and cutoff of charge that has passed through the third charge transfer channel 43, switches between transfer and cutoff of charge that has passed through the fourth charge transfer channel 44, switches between transfer and cutoff of charge that has passed through the fifth charge transfer channel 45, and switches between transfer and cutoff of charge that has passed through the sixth charge transfer channel 46, by switching the applied voltage.

Similarly, the second gate electrode 12 can switch between whether or not an inversion layer is formed on the surface of the injection region 15 positioned below the second gate electrode 12 by switching an applied voltage.

In other words, the second gate electrode 12 switches between transfer and cutoff of charge that has passed through the first charge transfer channel 41, by switching the applied voltage.

Furthermore, as mentioned above, the first charge transfer channel 41 is a region formed in a portion, of the injection region 15, that is located below the second gate electrode 12. Therefore, it can be said that the second gate electrode 12 is arranged overlaid above the first charge transfer channel 41.

Next, an imaging device according to the embodiment and configured including the photodetection device 10 having the aforementioned construction will be described.

Figure 7:
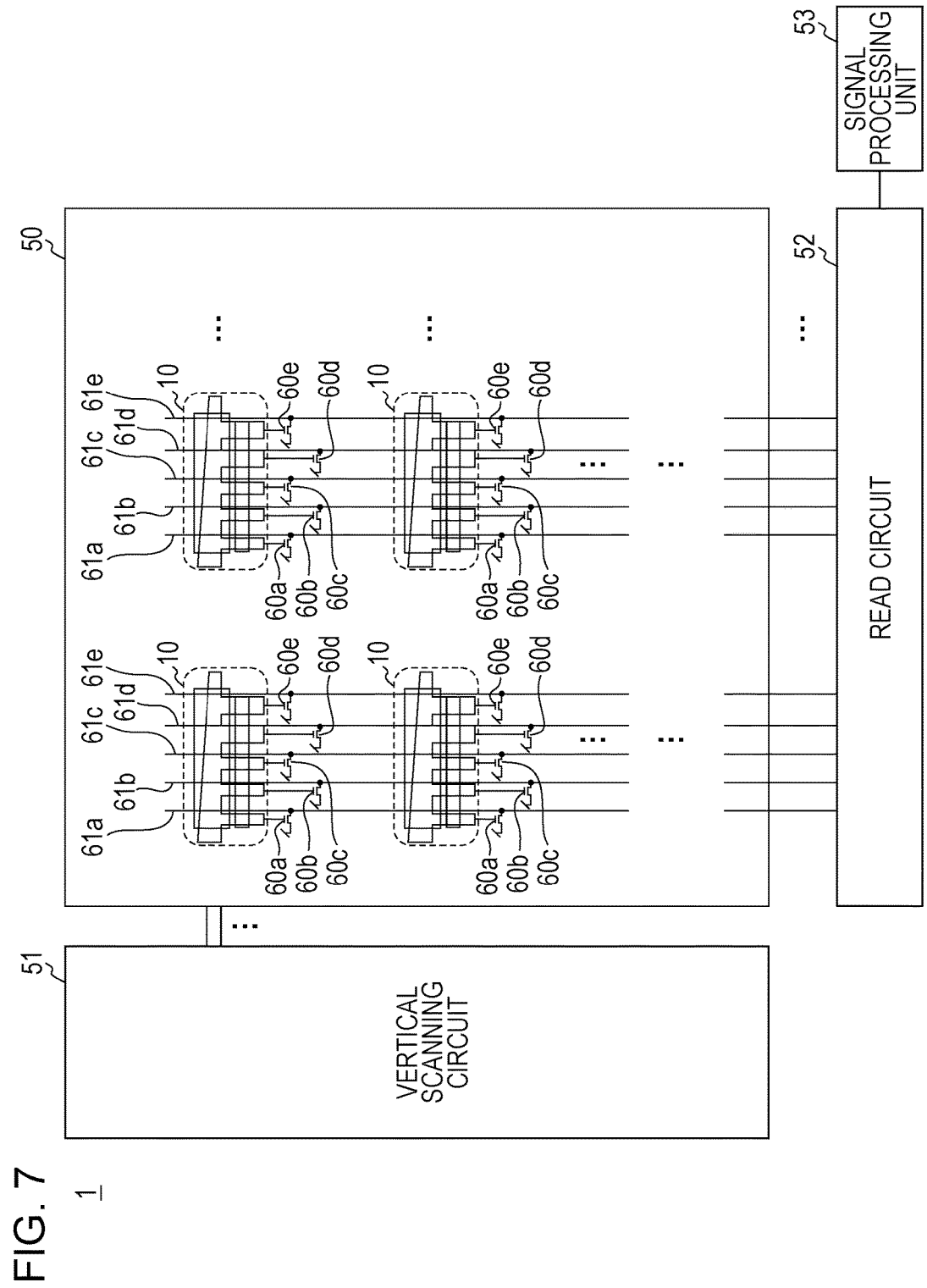
FIG. 7 is a block diagram depicting the configuration of an imaging device according to the embodiment.

FIG. 7 is a block diagram depicting the configuration of an imaging device 1 according to the embodiment.

As depicted in the same drawing, the imaging device 1 is provided with a pixel array 50, a vertical scanning circuit 51, a read circuit 52, and a signal processing unit 53.

The pixel array 50 is configured with a plurality of pixels configured from photodetection devices 10 being arranged in an array (a matrix form, for example).

In each photodetection device 10, the first charge accumulation unit 21 to the fifth charge accumulation unit 25 are connected to the read circuit 52 via the source follower transistors 60a to 60e and read lines 61a to 61e. In other words, the read circuits 70a to 70e in FIG. 1 each correspond to the read circuit 52 in FIG. 7. Here, the read lines 61a to 61e constitute common signal lines in column units.

Furthermore, each photodetection device 10 is connected to the vertical scanning circuit 51 via a plurality of common control signal lines (not depicted) in row units.

The vertical scanning circuit 51 controls the operation of each photodetection device 10 in row units, via the plurality of common control signal lines (not depicted) in row units, with respect to the pixel array 50.

The vertical scanning circuit 51 repeatedly carries out control of the photodetection devices 10 according to row units in predetermined periods, sequentially from the row at the uppermost side to the row at the lowermost side of the pixel array 50.

The read circuit 52 operates in synchronization with the vertical scanning circuit 51 and, from the pixel array 50, in the row units controlled by the vertical scanning circuit 51, reads signals corresponding to the amounts of charge accumulated in the first charge accumulation unit 21 to the fifth charge accumulation unit 25 in each photodetection device 10 positioned in the row in question. The signals that have been read are then output to the signal processing unit 53.

The signal processing unit 53 carries out various types of signal processing with respect to the signals that have been output from the read circuit 52. As an example, the signal processing unit 53 may be configured including a processor and a memory and realized by the processor executing a program stored in the memory, or may be realized by means of dedicated hardware.

[1-2. Examination]

Hereinafter, the photodetection device 10 will be examined.

Figure 8A:
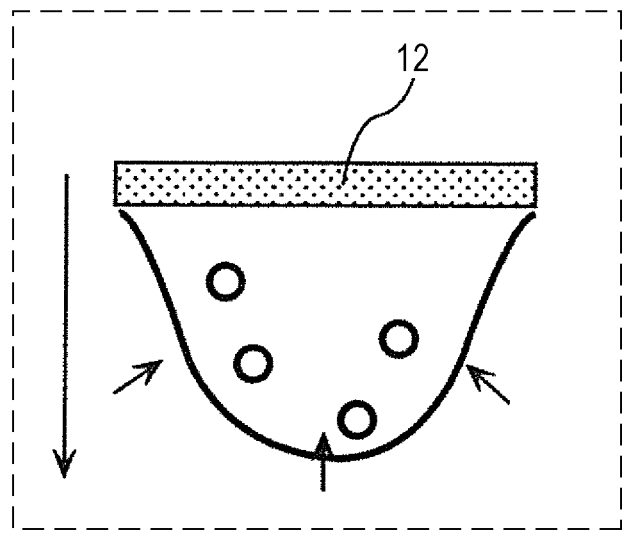
FIG. 8A is a schematic view depicting the potential of the first charge transfer channel, in a cross section along line VIIIA-VIIIA.
Figure 8B:
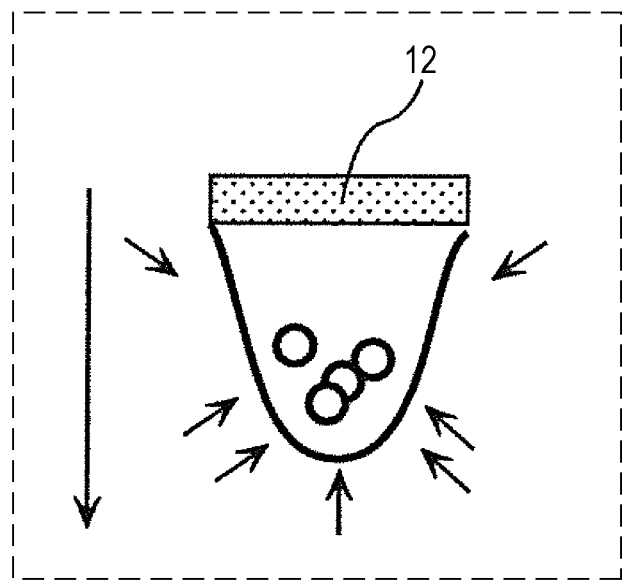
FIG. 8B is a schematic view depicting the potential of the first charge transfer channel, in a cross section along line VIIIB-VIIIB.

FIG. 8A is a schematic view depicting the potential of the first charge transfer channel 41, in a cross section along line VIIIA-VIIIA in FIG. 4, and FIG. 8B is a schematic view depicting the potential of the first charge transfer channel 41, in a cross section along line VIIIB-VIIIB in FIG. 4.

As mentioned above, the width of the first charge transfer channel 41 narrows in a tapered shape from the first end side to the second end side. Therefore, as depicted in FIGS. 8A and 8B, with regard to the electric field of the first charge transfer channel 41, the electric field per unit area at the second end side becomes larger than the electric field per unit area at the first end side due to the effect of a fringing electric field. It is known that, generally, charge dispersion is suppressed as the electric field intensity increases. Therefore, with a charge group that is traveling through the first charge transfer channel 41, the suppression of charge dispersion acts more strongly the further the charge group travels from the photoelectric conversion unit 13.

FIG. 9 is a schematic view depicting the way in which a spread in the distribution of charge density is suppressed in a charge group that is traveling through the first charge transfer channel 41 at a position that is comparatively far from the photoelectric conversion unit 13 (here, in the vicinity of the TG5, for example), due to the width of the first charge transfer channel 41 narrowing in a tapered shape from the first end side to the second end side. In the same drawing, a waveform 91 depicted by a solid line indicates a spread in the distribution of charge density in a charge group that is traveling, in a case where the width of the first charge transfer channel 41 narrows in a tapered shape as mentioned above. A waveform 92 depicted by a dotted line indicates the distribution of charge density that is assumed in a case where the width of the first charge transfer channel 41 does not narrow in a tapered shape as in the reference example.

As is also understood from FIG. 9, the photodetection device 10 according to the embodiment is able to suppress a spread in the distribution of charge density in a charge group that has traveled to a position that is comparatively far from the photoelectric conversion unit 13.

Consequently, according to the photodetection device 10 as in the embodiment, it is possible to improve temporal resolution in the detection of a timing at which light is incident.

Meanwhile, a configuration is also feasible in which the electric field intensity of the entire first charge transfer channel 41 is uniformly increased. However, in this configuration, the transfer time itself in which the charge generated by the photoelectric conversion unit 13 is transferred through the first charge transfer channel 41 to the charge sweeping unit 14 shortens. Therefore, it cannot be said that this configuration is always effective in improving temporal resolution in the detection of a timing at which light is incident. It can be said that a configuration in which the electric field intensity of the first charge transfer channel 41 increases as the distance from the photoelectric conversion unit 13 increases, as in the photodetection device 10 according to the embodiment, is more effective in improving temporal resolution in the detection of a timing at which light is incident. As mentioned above, in the photodetection device 10 according to the embodiment, due to the physical shape thereof, the electric field intensity of the first charge transfer channel 41 is controlled in such a way as to increase as the distance from the photoelectric conversion unit 13 increases.

Modified Example 1

Here, an imaging device according to modified example 1 in which a portion of the configuration has been altered from that of the imaging device 1 according to the embodiment will be described.

In the embodiment, the photodetection device 10 constituting the imaging device 1 had a configuration in which the shape of the main section 30 in the injection region 15 was a long tapered shape whereas the second gate electrode 12 was rectangular.

In contrast, in modified example 1, the photodetection device constituting the imaging device according to modified example 1 has a configuration in which the shape of the main section in the injection region is rectangular whereas the second gate electrode has a long tapered shape.

[2-1. Configuration]

Hereinafter, an imaging device according to modified example 1 will be described with reference to the drawings, focusing on the differences with the imaging device 1 according to the embodiment.

Figure 10:
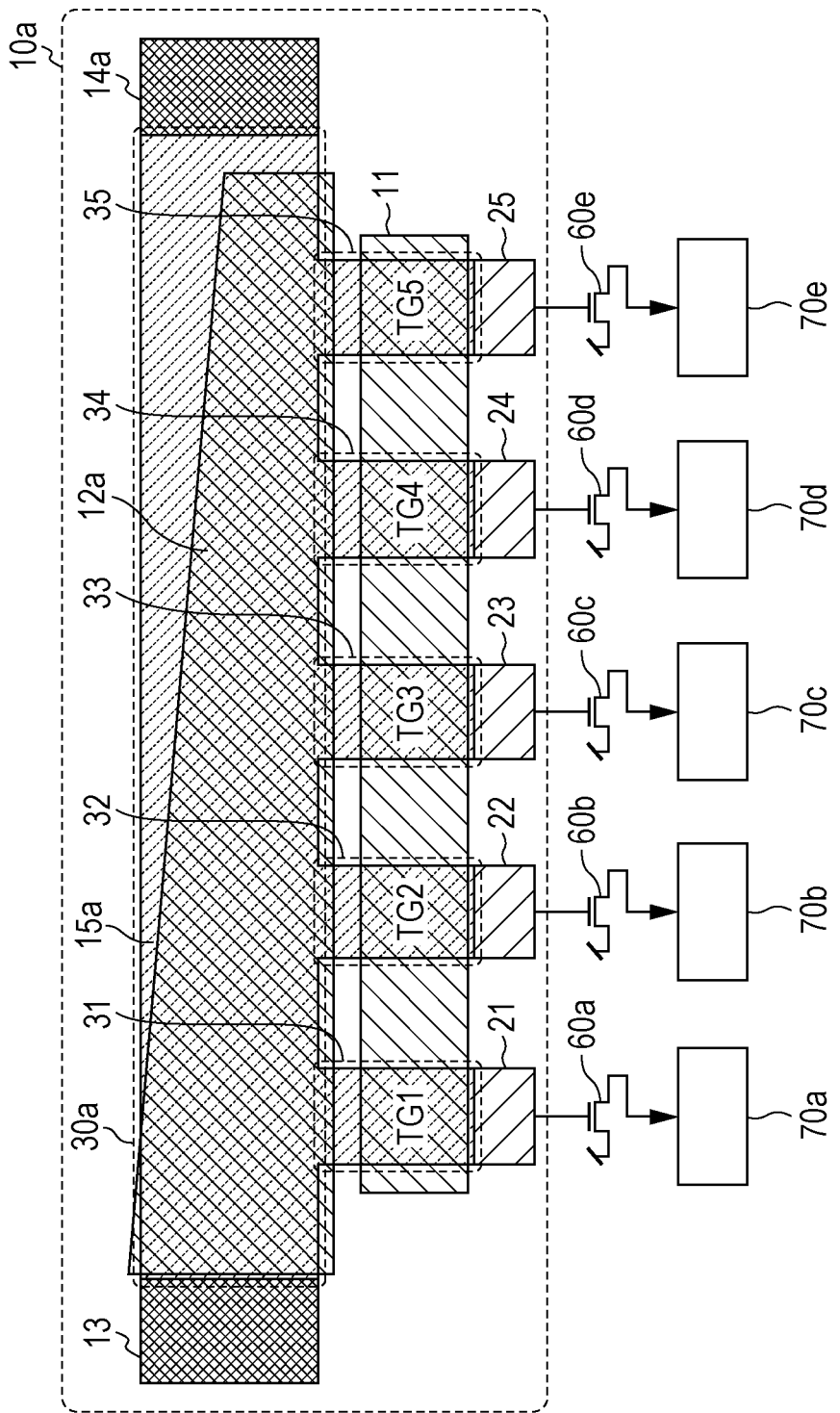
FIG. 10 is a plan view of a photodetection device according to modified example 1.

FIG. 10 is a plan view of a photodetection device 10a according to modified example 1.

As depicted in the same drawing, from the photodetection device 10 according to the embodiment, the injection region 15 has been altered to an injection region 15a, the second gate electrode 12 has been altered to a second gate electrode 12a, and the charge sweeping unit 14 has been altered to a charge sweeping unit 14a in the photodetection device 10a.

From the injection region 15 according to the embodiment, the main section 30 has been altered to a main section 30a in the injection region 15a.

The main section 30a according to the present modified example 1 is rectangular as depicted in FIG. 10.

The charge sweeping unit 14a has been altered from the charge sweeping unit 14 according to the embodiment in such a way that the width thereof matches the width of the charge sweeping unit 14a side of the main section 30a.

The second gate electrode 12a has one end at the photoelectric conversion unit 13 side (hereinafter, also referred to as a "third end") and another end at the charge sweeping unit 14a side (hereinafter, also referred to as a "fourth end"). The second gate electrode 12a has a long tapered shape and is arranged overlaid above the main section 30. As depicted in FIG. 10, in the second gate electrode 12a, the width of the third end is greater than the width of the fourth end. Also, the width of the second gate electrode 12a monotonically decreases from the third end toward the fourth end. Furthermore, the difference between the width of the third end of the second gate electrode 12a and the width of the injection region 15a directly below the third end is less than the difference between the width of the fourth end of the second gate electrode 12a and the width of the injection region 15a directly below the fourth end. Also, the width of the injection region 15a directly below the third end of the second gate electrode 12a is equal to the width of the injection region 15a directly below the fourth end of the second gate electrode 12a.

Similar to the case of the embodiment, in the injection region 15a, a predetermined potential is applied to a gate electrode positioned thereabove (here, the first gate electrode 11 or the second gate electrode 12, for example), and a charge transfer channel is thereby formed on a surface portion thereof.

Figure 11:
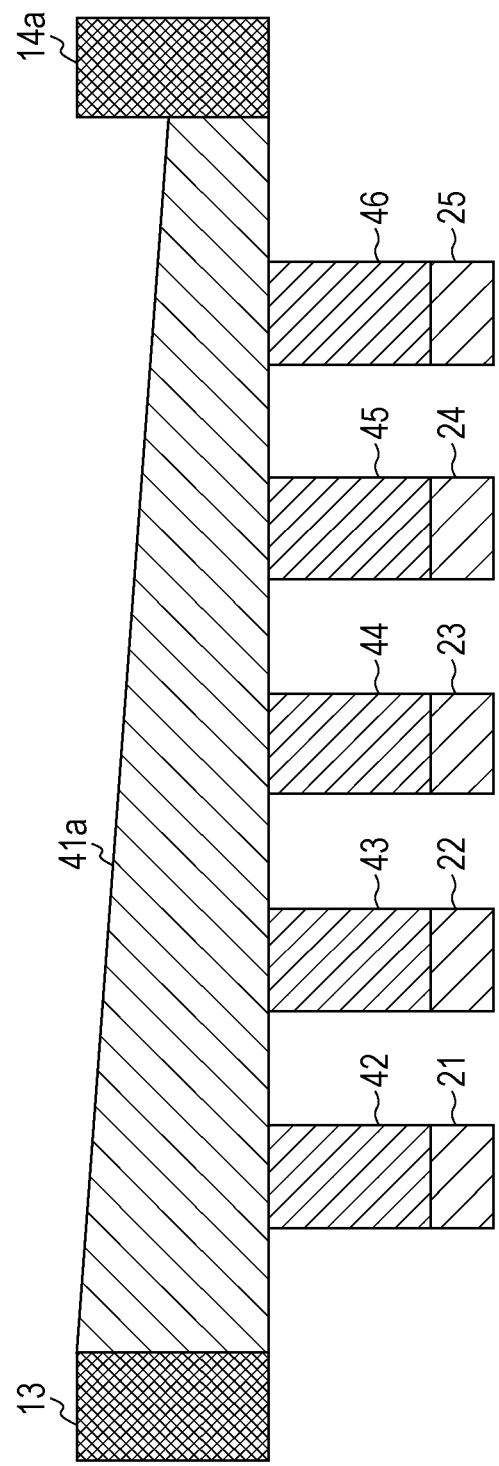
FIG. 11 is a schematic view of charge transfer channels formed in the photodetection device according to modified example 1.

FIG. 11 is a schematic view schematically depicting charge transfer channels formed in a case where a first predetermined potential is applied to the first gate electrode 11 and a second predetermined potential is applied to the second gate electrode 12. Here, the first predetermined potential is a potential for forming inversion layers on the surfaces of the injection region 15a positioned below the first gate electrode 11, and the second predetermined potential is a potential for forming an inversion layer on the surface of the injection region 15a positioned below the second gate electrode 12.

As depicted in FIG. 11, from the charge transfer channels according to the embodiment (see FIG. 4), the charge transfer channels formed on the surface of the injection region 15a have been formed in such a way that the first charge transfer channel 41 has been altered to a first charge transfer channel 41a.

As depicted in the same drawing, the first charge transfer channel 41a has a long tapered shape similar to the first charge transfer channel 41 according to the embodiment. Furthermore, the first charge transfer channel 41a has one end at the photoelectric conversion unit 13 side (hereinafter, also referred to as a "first end") and another end at the charge sweeping unit 14 side (hereinafter, also referred to as a "second end"), and the width of the first end is greater than the width of the second end. Also, the width of the first charge transfer channel 41 monotonically decreases from the first end toward the second end.

[2-2. Examination]

Hereinafter, the photodetection device 10a will be examined.

As depicted in FIG. 11, the width of the first charge transfer channel 41a narrows in a tapered shape from the first end side to the second end side similar to the case of the first charge transfer channel 41 according to the embodiment.

Therefore, the photodetection device 10a according to modified example 1 is able to suppress a spread in the distribution of charge density in a charge group that has traveled to a position that is comparatively far from the photoelectric conversion unit 13, similar to the case of the photodetection device 10 according to the embodiment.

Consequently, according to the photodetection device 10a as in modified example 1, it is possible to improve temporal resolution in the detection of a timing at which light is incident.

Furthermore, generally, from a manufacturing viewpoint, controlling the manufacturing process in such a way that the shape of a gate electrode is a tapered shape is easier than controlling the manufacturing process in such a way that an injection region for an impurity has a tapered shape. Therefore, with the photodetection device 10a according to the present modified example 1, the manufacturing process can be managed more easily.

Modified Example 2

Here, an imaging device according to modified example 2 in which a portion of the configuration has been altered from that of the imaging device 1 according to the embodiment will be described.

A photodetection device constituting the imaging device according to modified example 2 has a configuration in which the shape of the main section in the injection region and the second gate electrode are both a long tapered shape.

[3-1. Configuration]

Hereinafter, an imaging device according to modified example 2 will be described with reference to the drawings, focusing on the differences with the imaging device 1 according to the embodiment.

Figure 12:
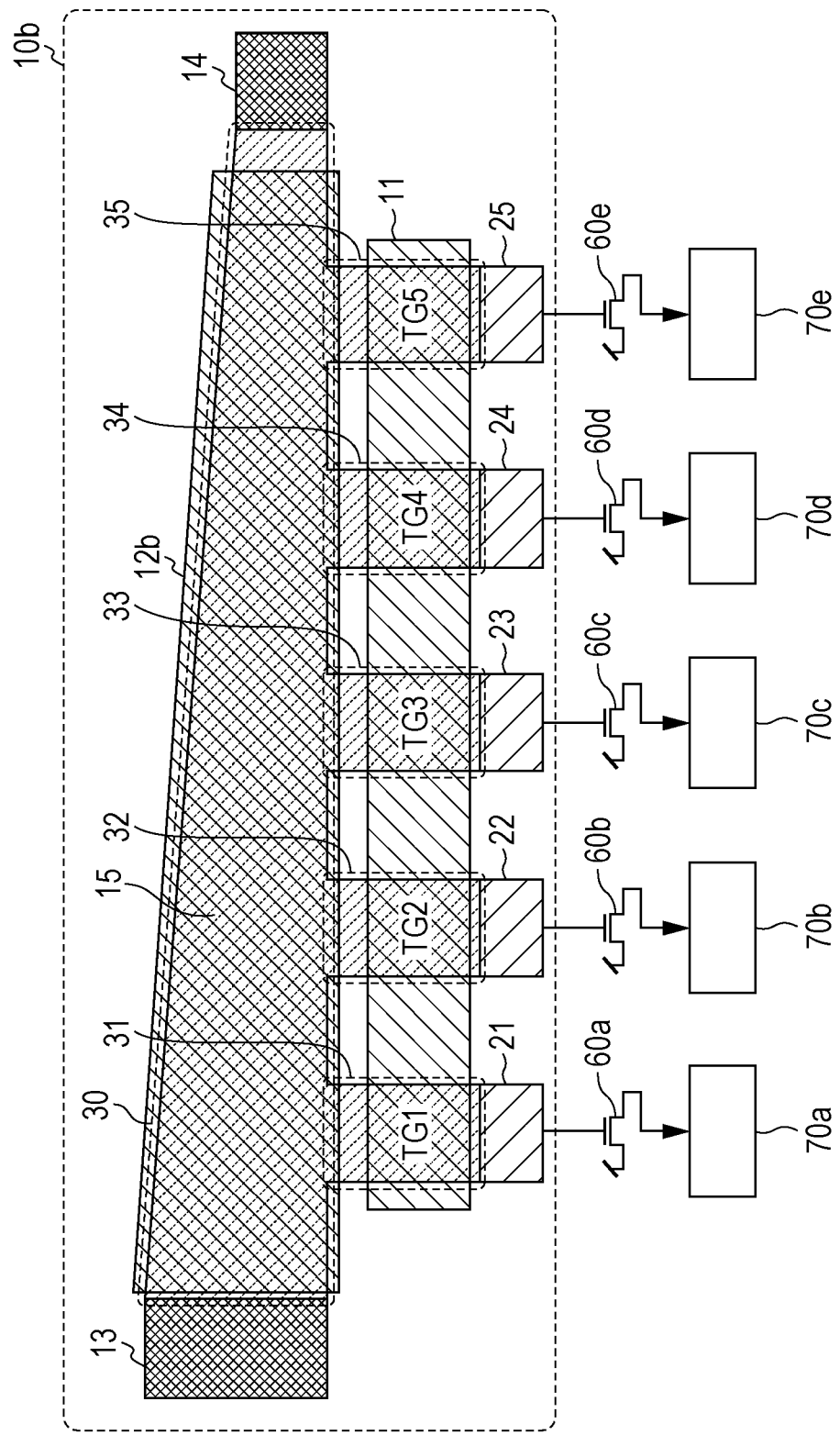
FIG. 12 is a plan view of a photodetection device according to modified example 2.

FIG. 12 is a plan view of a photodetection device 10b according to modified example 2.

As depicted in the same drawing, from the photodetection device 10 according to the embodiment, the second gate electrode 12 has been altered to a second gate electrode 12b in the photodetection device 10b.

The second gate electrode 12b has one end at the photoelectric conversion unit 13 side (hereinafter, also referred to as a "third end") and another end at the charge sweeping unit 14 side (hereinafter, also referred to as a "fourth end"). The second gate electrode 12b has a long tapered shape and is arranged overlaid above the main section 30. As depicted in FIG. 12, in the second gate electrode 12b, the width of the third end is greater than the width of the fourth end. Also, the width of the second gate electrode 12b monotonically decreases from the third end toward the fourth end. Also, the width of the injection region 15 directly below the third end of the second gate electrode 12b is greater than the width of the injection region 15 directly below the fourth end of the second gate electrode 12b.

Similar to the case of the embodiment, in the injection region 15, a predetermined potential is applied to a gate electrode positioned thereabove (here, the first gate electrode 11 or the second gate electrode 12b, for example), and a charge transfer channel is thereby formed on a surface portion thereof.

In modified example 2, the shape of the region in which the injection region 15 and the second gate electrode 12b overlap is equal to the shape of the region in which the injection region 15 and the second gate electrode 12 overlap in the embodiment.

Consequently, the charge transfer channels formed in a case where the first predetermined potential is applied to the first gate electrode 11 and the second predetermined potential is applied to the second gate electrode 12b are similar to the charge transfer channels formed in the embodiment, depicted in FIG. 4.

In other words, the charge transfer channels formed on the surface of the injection region 15 are configured from the first charge transfer channel 41, the second charge transfer channel 42, the third charge transfer channel 43, the fourth charge transfer channel 44, the fifth charge transfer channel 45, and the sixth charge transfer channel 46, as depicted in FIG. 4.

[3-2. Examination]

Hereinafter, the photodetection device 10b will be examined.

As mentioned above, charge transfer channels that are similar to the charge transfer channels formed in the photodetection device 10 according to the embodiment are formed in the photo detection device 10b.

Therefore, the photodetection device 10b according to modified example 2 is able to suppress a spread in the distribution of charge density in a charge group that has traveled to a position that is comparatively far from the photoelectric conversion unit 13, similar to the case of the photodetection device 10 according to the embodiment.

Consequently, according to the photodetection device 10b as in modified example 2, it is possible to improve temporal resolution in the detection of a timing at which light is incident.

Furthermore, in the photodetection device 10b, the transfer of charge from the first charge transfer channel 41, to the second charge transfer channel 42 to the sixth charge transfer channel 46, is assisted by a fringing electric field at a side surface opposite to the read circuit side in the second gate electrode 12b. Therefore, a configuration in which the shape of the main section 30 in the injection region 15 and the second gate electrode 12b are both a long tapered shape as in the photodetection device 10b according to the present modified example 2 is able to improve temporal resolution in the detection of a timing at which light is incident, to a greater extent than a configuration in which only the shape of the main section 30 in the injection region 15 has a long tapered shape as in the photodetection device 10 according to the embodiment.

Supplement

The embodiment and modified examples 1 and 2 have been described as mentioned above as exemplifications of the technique disclosed in the present application. However, the technique according to the present disclosure is not restricted thereto and can also be applied to an embodiment in which an alteration, substitution, addition, omission, or the like has been implemented as appropriate provided it does not depart from the gist of the present disclosure.

Hereinafter, examples of modified examples in the present disclosure will be listed.

(1) In the embodiment, the photodetection device 10 was described as being provided with five charge accumulation units. However, the number of charge accumulation units provided in the photodetection device 10 is not necessarily restricted to the example of five as long as there is one or more.

(2) In the embodiment, the photodetection device 10 was described as being a structure provided with one first gate electrode 11. However, it is not always necessary for the first gate electrode 11 to be a single structure, and the first gate electrode 11 may be configured divided into a plurality. That is, it is sufficient as long as the first gate electrode 11 is able to realize switching between transfer and cutoff of charge that has passed through the second charge transfer channel 42, switching between transfer and cutoff of charge that has passed through the third charge transfer channel 43, switching between transfer and cutoff of charge that has passed through the fourth charge transfer channel 44, switching between transfer and cutoff of charge that has passed through the fifth charge transfer channel 45, and switching between transfer and cutoff of charge that has passed through the sixth charge transfer channel 46, by switching the applied voltage.

(3) In the embodiment, when describing the photodetection device 10 using FIG. 1 and the like, a description was given with the widths of the first finger section 31 to the fifth finger section 35 being depicted as though equal, and the widths of the first charge accumulation unit 21 to the fifth charge accumulation unit 25 being depicted as though equal. However, the photodetection device 10 is not restricted to the configuration example in which the widths of the first finger section 31 to the fifth finger section 35 are equal, and is not restricted to the configuration example in which the widths of the first charge accumulation unit 21 to the fifth charge accumulation unit 25 are equal. For example, the photodetection device 10 may have a configuration in which at least one of the widths of the first finger section 31 to the fifth finger section 35 is different from the other widths, and at least one of the widths of the first charge accumulation unit 21 to the fifth charge accumulation unit 25 is different from the other widths.

(4) In the embodiment and modified examples 1 and 2, when describing the photodetection device 10, the photodetection device 10a, and the photo detection device 10b using the drawings, descriptions were given with the width of the main section 30 being depicted in such a way as to monotonically decrease in a linear manner from the fifth end toward the sixth end. The widths of the second gate electrode 12a and the second gate electrode 12b were described being depicted in such a way as to monotonically decrease in a linear manner from the third end toward the fourth end. The widths of the first charge transfer channel 41 and the first charge transfer channel 41a were described being depicted in such a way as to monotonically decrease in a linear manner from the first end toward the second end. However, the photodetection device 10, the photodetection device 10a, and the photodetection device 10b are not restricted to the configuration example in which the width of the main section 30 monotonically decreases in a linear manner from the fifth end toward the sixth end, as long as the width of the fifth end is greater than the width of the sixth end. There is no restriction to the configuration example in which the widths of the second gate electrode 12a and the second gate electrode 12b monotonically decrease in a linear manner from the third end toward the fourth end, as long as the width of the third end is greater than the width of the fourth end. There is no restriction to the configuration example in which the widths of the first charge transfer channel 41 and the first charge transfer channel 41a monotonically decrease in a linear manner from the first end toward the second end, as long as the width of the first end is greater than the width of the second end. For example, the photodetection device 10, the photodetection device 10a, and the photodetection device 10b may have a configuration in which the width of the main section 30 monotonically decreases in a stepped form or a curved form from the fifth end toward the sixth end. A configuration may be adopted in which the widths of the second gate electrode 12 and the second gate electrode 12b monotonically decrease in a stepped form or a curved form from the third end toward the fourth end. A configuration may be adopted in which the widths of the first charge transfer channel 41 and the first charge transfer channel 41a monotonically decrease in a stepped form or a curved form from the first end toward the second end.

Figure 13:
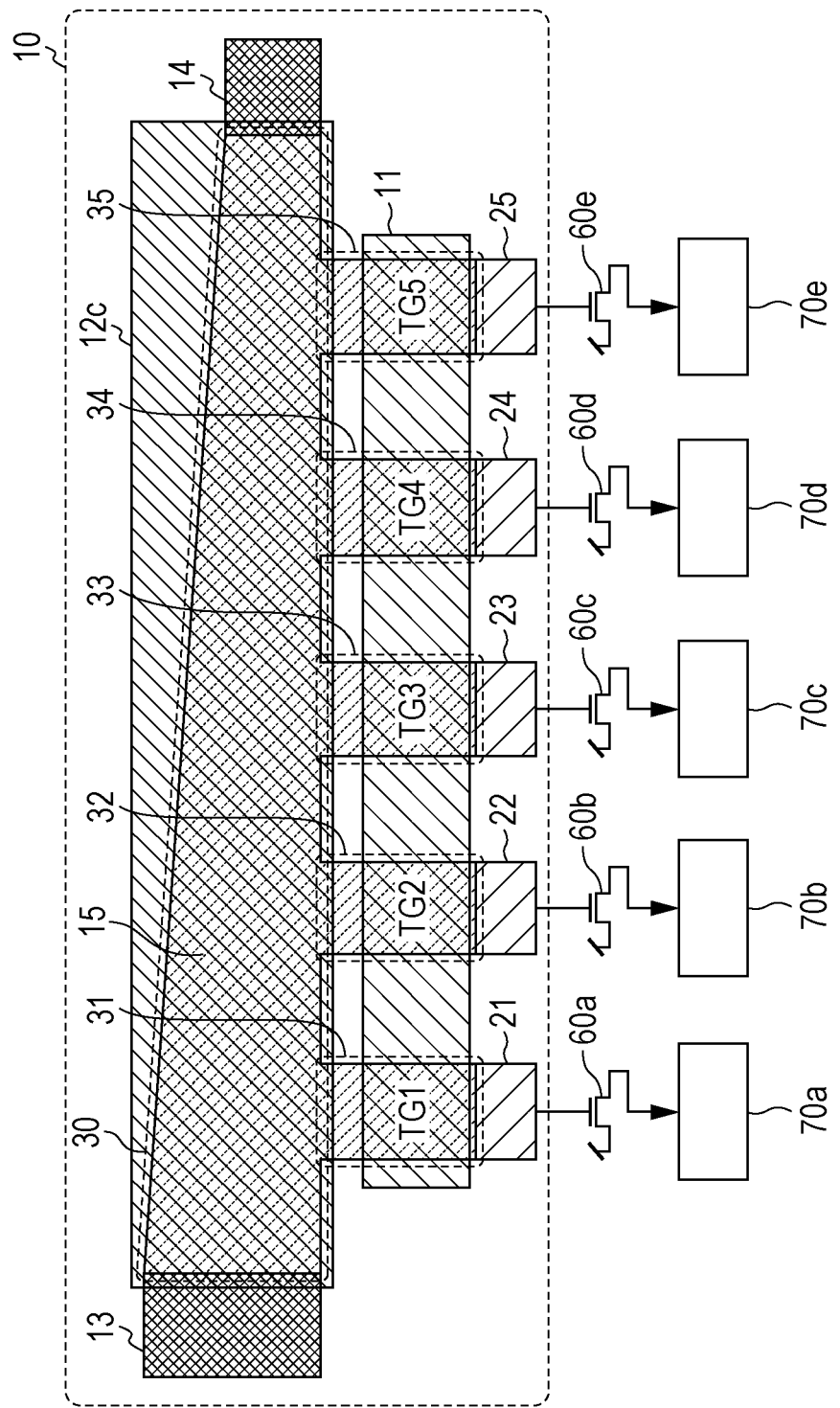
FIG. 13 is a plan view of a photodetection device according to another modified example.

(5) In the embodiment, the photodetection device 10 was described being depicted in FIG. 1 as though the second gate electrode 12 does not overlap the photoelectric conversion unit 13. However, a portion of the second gate electrode 12 may overlap the photoelectric conversion unit 13. Furthermore, the photodetection device 10 was described being depicted in FIG. 1 as though the second gate electrode 12 does not overlap the charge sweeping unit 14. However, a portion of the second gate electrode 12 may overlap the charge sweeping unit 14. As an example, the photodetection device 10 may have a configuration provided with a second gate electrode 12c which has portions that overlap the photoelectric conversion unit 13 and the charge sweeping unit 14, as depicted in FIG. 13.

Figure 14:
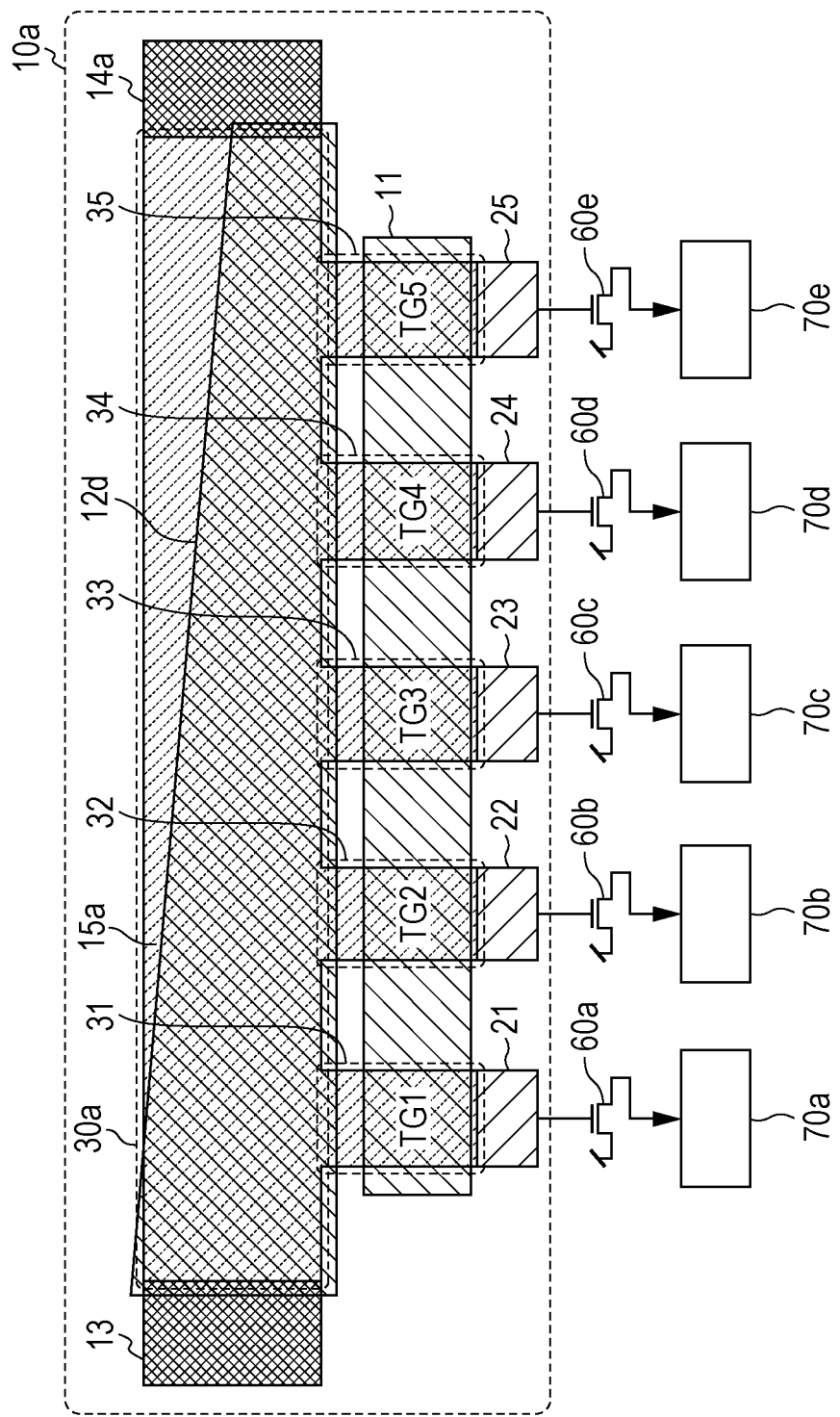
FIG. 14 is a plan view of a photodetection device according to another modified example.

In modified example 1, the photodetection device 10a was described being depicted in FIG. 10 as though the second gate electrode 12a does not overlap the photoelectric conversion unit 13. However, a portion of the second gate electrode 12a may overlap the photoelectric conversion unit 13. Furthermore, the photodetection device 10a was described being depicted in FIG. 10 as though the second gate electrode 12a does not overlap the charge sweeping unit 14a. However, a portion of the second gate electrode 12a may overlap the charge sweeping unit 14a. As an example, the photodetection device 10a may have a configuration provided with a second gate electrode 12d which has portions that overlap the photoelectric conversion unit 13 and the charge sweeping unit 14a, as depicted in FIG. 14.

Figure 15:
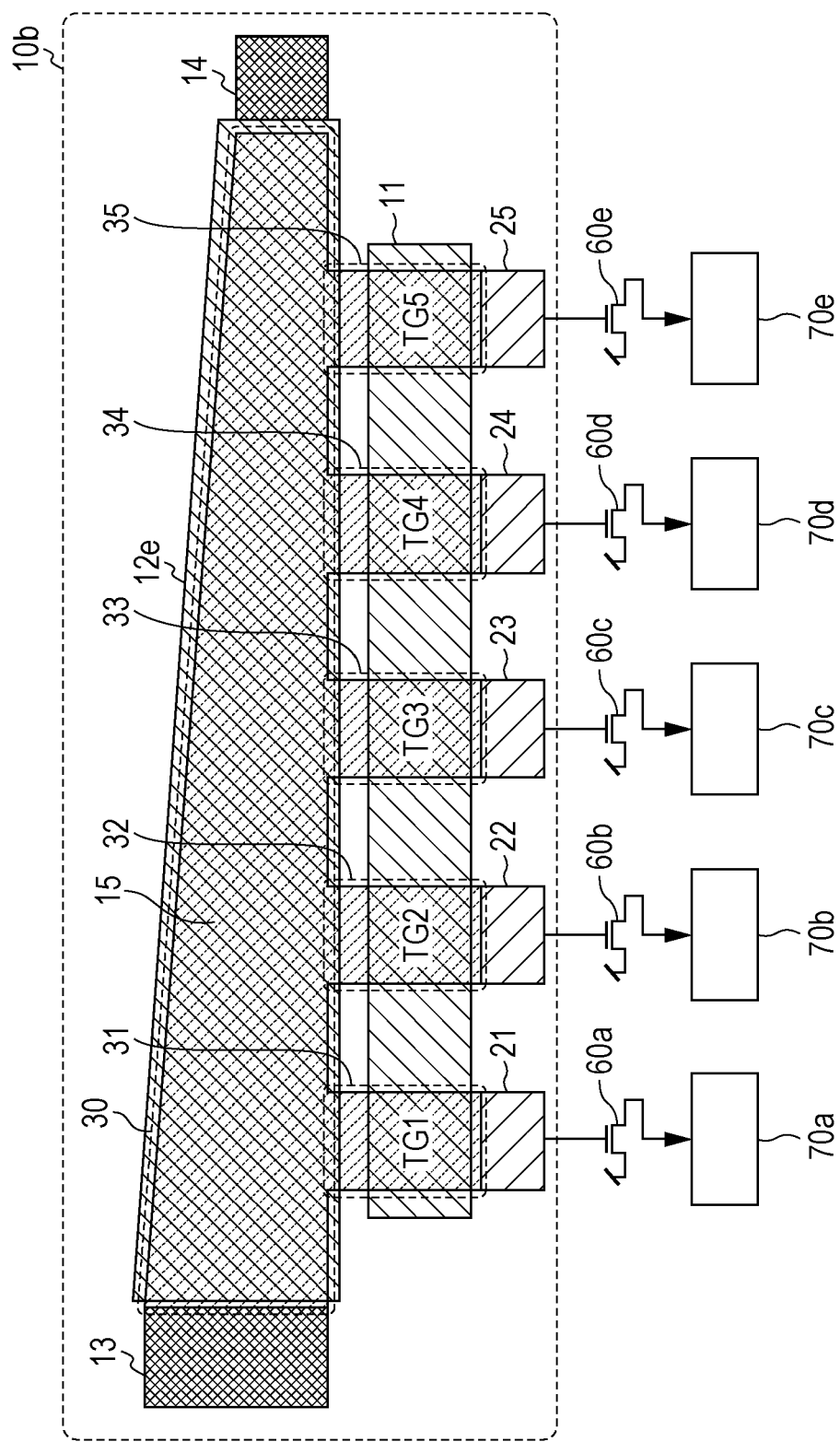
FIG. 15 is a plan view of a photodetection device according to another modified example.

In modified example 2, the photodetection device 10b was described being depicted in FIG. 12 as though the second gate electrode 12b does not overlap the photoelectric conversion unit 13. However, a portion of the second gate electrode 12b may overlap the photoelectric conversion unit 13. Furthermore, the photodetection device 10b was described being depicted in FIG. 12 as though the second gate electrode 12b does not overlap the charge sweeping unit 14. However, a portion of the second gate electrode 12b may overlap the charge sweeping unit 14. As an example, the photodetection device 10b may have a configuration provided with a second gate electrode 12e which has portions that overlap the photoelectric conversion unit 13 and the charge sweeping unit 14, as depicted in FIG. 15.

(6) In the embodiment, a photodiode was given as an example of a photoelectric conversion element. However, the photoelectric conversion element is not necessarily restricted to a photodiode as long as it is able to receive incident light and generate charge. As an example, the photoelectric conversion element may be an element configured with photoelectric conversion films being layered.

The photodetection device and imaging device according to the present disclosure can be widely used for devices which detect light that has been input.

What is claimed is:

1. A photodetection device, comprising:
a photoelectric converter that generates charge;
a first charge transfer channel that has a first end and a second end, the first end being connected to the photoelectric converter, charge from the photoelectric converter being transferred in the first charge transfer channel in a first direction from the first end toward the second end;
a second charge transfer channel that diverges from the first charge transfer channel at a first position of the first charge transfer channel;
a third charge transfer channel that diverges from the first charge transfer channel at a second position of the first charge transfer channel, the second position being further than the first position from the first end in the first direction;
a first charge accumulator that accumulates charge transferred from the first charge transfer channel through the second charge transfer channel;
a second charge accumulator that accumulates charge transferred from the first charge transfer channel through the third charge transfer channel; and
at least one first gate electrode that switches between transfer and cutoff of charge in the second charge transfer channel, and that switches between transfer and cutoff of charge in the third charge transfer channel, wherein
a width of the first charge transfer channel at the first position is greater than a width of the first charge transfer channel at the second position in a plan view.

2. The photodetection device according to claim 1, wherein a width of the first charge transfer channel monotonically decreases from the first end toward the second end.

3. The photodetection device according to claim 1, further comprising
a second gate electrode that covers the first charge transfer channel, the second gate electrode switching between transfer and cutoff of charge in the first charge transfer channel, wherein
the second gate electrode has a third end and a fourth end, the third end being on a side of the first end, the fourth end being on a side of the second end, and
a width of the second gate electrode at the third end is greater than a width of the second gate electrode at the fourth end.

4. The photodetection device according to claim 3, wherein a width of the second gate electrode monotonically decreases from the third end toward the fourth end.

5. The photodetection device according to claim 3, comprising
a semiconductor substrate that includes a diffusion region, the first charge transfer channel being located in the diffusion region.

6. The photodetection device according to claim 5, wherein a difference between the width of the second gate electrode at the third end and a width of the diffusion region under the third end is less than a difference between the width of the second gate electrode at the fourth end and a width of the diffusion region under the fourth end.

7. The photodetection device according to claim 6, wherein the width of the diffusion region under the third end is equal to the width of the diffusion region under the fourth end.

8. The photodetection device according to claim 5, wherein a width of the diffusion region under the third end is greater than a width of the diffusion region under the fourth end.

9. The photodetection device according to claim 1, comprising
a semiconductor substrate that includes a diffusion region, wherein
the first charge transfer channel is located in the diffusion region, and
a first width of the diffusion region along the first end is greater than a second width of the diffusion region along the second end.

10. The photodetection device according to claim 9, further comprising
a second gate electrode that covers the first charge transfer channel, the second gate electrode switching between transfer and cutoff of charge in the first charge transfer channel, wherein
the second gate electrode has a third end and a fourth end, the third end being on a side of the first end, the fourth end being on a side of the second end.

11. The photodetection device according to claim 10, wherein a width of the second gate electrode at the third end is greater than the first width of the diffusion region.

12. The photodetection device according to claim 10, wherein a difference between a width of the second gate electrode at the third end and the first width of the diffusion region is less than a difference between a width of the second gate electrode at the fourth end and the second width of the diffusion region.

13. The photodetection device according to claim 10, wherein a width of the second gate electrode at the third end is equal to a width of the second gate electrode at the fourth end.

14. The photodetection device according to claim 1, further comprising a charge sweeper that is connected to the second end of the first charge transfer channel.

15. An imaging device, comprising a pixel array in which a plurality of pixels configured from the photodetection device according to claim 1, are arranged in an array.

16. The photodetection device according to claim 1, wherein a width of the first charge transfer channel at the first end is greater than a width of the first charge transfer channel at the second end in the plan view.

* * * * *